United States Patent
Nishimoto et al.

(10) Patent No.: US 8,865,509 B2
(45) Date of Patent: Oct. 21, 2014

(54) CLEANING METHOD OF SILICON SUBSTRATE AND MANUFACTURING METHOD OF SOLAR BATTERY

(75) Inventors: Yoichiro Nishimoto, Tokyo (JP);
Nozomu Yasunaga, Tokyo (JP);
Takayoshi Matsuda, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/824,415

(22) PCT Filed: Mar. 15, 2012

(86) PCT No.: PCT/JP2012/056738
§ 371 (c)(1),
(2), (4) Date: Mar. 18, 2013

(87) PCT Pub. No.: WO2012/150669
PCT Pub. Date: Nov. 8, 2012

(65) Prior Publication Data
US 2013/0244369 A1    Sep. 19, 2013

(30) Foreign Application Priority Data
May 2, 2011  (WO) .................. PCT/JP2011/060525

(51) Int. Cl.
*H01L 21/00* (2006.01)
*H01L 21/306* (2006.01)
*H01L 31/18* (2006.01)
*H01L 31/0236* (2006.01)

(52) U.S. Cl.
CPC ........... *H01L 21/30604* (2013.01); *Y02E 10/50* (2013.01); *H01L 31/18* (2013.01); *H01L 31/02363* (2013.01)
USPC ...................................... 438/71; 257/E31.13

(58) Field of Classification Search
CPC .................... H01L 31/02167; H01L 33/52
USPC ....................................... 438/71; 257/E31.13
See application file for complete search history.

(56) References Cited

U.S. PATENT DOCUMENTS

| 8,119,438 B2 | 2/2012 | Nishimoto |
| 8,715,420 B2 | 5/2014 | Tanaka et al. |

(Continued)

FOREIGN PATENT DOCUMENTS

| CN | 101573801 A | 11/2009 |
| JP | 2001-327933 A | 11/2001 |

(Continued)

OTHER PUBLICATIONS

International Search Report (PCT/ISA/210) issued on Jun. 12, 2012, by the Japanese Patent Office as the International Searching Authority for International Application No. PCT/JP2012/056738.

(Continued)

*Primary Examiner* — Mark A Laurenzi
(74) *Attorney, Agent, or Firm* — Buchanan Ingersoll & Rooney PC

(57) ABSTRACT

A cleaning method of a silicon substrate includes a first step of etching a surface of a silicon substrate by a metal-ion-containing mixed aqueous solution of an oxidizing agent and hydrofluoric acid and of forming a porous layer on the surface of the silicon substrate, a second step of etching a pore of the porous layer by mixed acid mainly containing hydrofluoric acid and nitric acid and of forming texture on the surface of the silicon substrate, a third step of etching the surface of the silicon substrate on which the texture is formed with an alkaline chemical solution, and a fourth step of treating the silicon substrate etched by the alkaline chemical solution by ozone-containing water, of generating an air bubble within the pore formed in the silicon substrate, and of removing metal and organic impurities from within the pore.

12 Claims, 7 Drawing Sheets

(56) References Cited

U.S. PATENT DOCUMENTS

| | | |
|---|---|---|
| 2010/0029034 A1 | 2/2010 | Nishimoto |
| 2011/0048527 A1 | 3/2011 | Irizarry et al. |
| 2012/0094887 A1 | 4/2012 | Tanaka et al. |

FOREIGN PATENT DOCUMENTS

| | | |
|---|---|---|
| JP | 2006-269960 A | 10/2006 |
| JP | 2007-73806 A | 3/2007 |
| JP | 3925867 B2 | 6/2007 |
| JP | 2008-124413 A | 5/2008 |
| JP | 2010-74102 A | 4/2010 |
| TW | 201108249 | 3/2011 |
| TW | 201112325 | 4/2011 |
| TW | 201105588 | 2/2012 |
| WO | WO 2009/054076 A1 | 4/2009 |

OTHER PUBLICATIONS

Written Opinion (PCT/ISA/237) issued on Jun. 12, 2012, by the Japanese Patent Office as the International Searching Authority for International Application No. PCT/JP2012/056738.

Tsujino et al., "Morphology of nanoholes formed in silicon by wet etching in solutions containing HF and $H_2O_2$ at different concentrations using silver nanoparticles as catalysts", ScienceDirect, Journal of Electrochimica Acta, No. 53, 2007, pp. 28-34.

Office Action issued in corresponding Taiwan Patent Appin. No. 100136891, dated Feb. 14, 2014, with English translation (12 pages).

Taiwanese Office Action issued in corresponding Taiwanese Application No. 101114326, mailed Jun. 4, 2014. An English language translation of the Office Action is included.

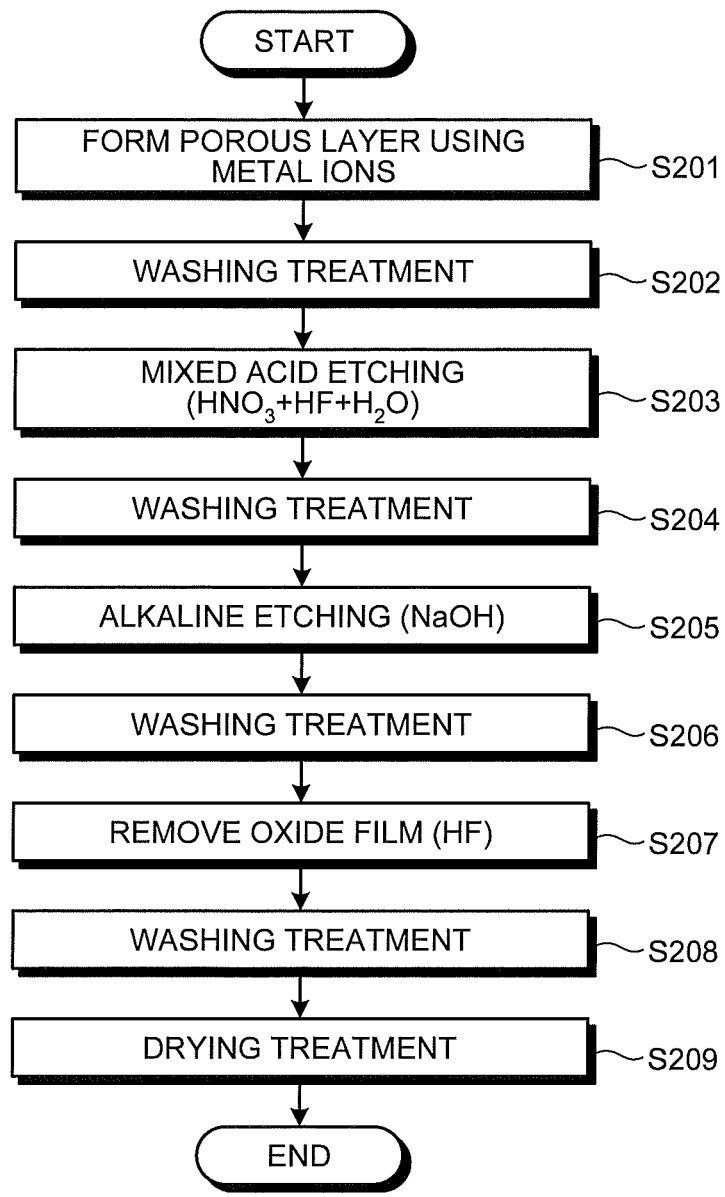

FIG.6

| | PROCESSING STEP | | | | |
|---|---|---|---|---|---|
| | DAMAGE ETCHING | TEXTURE FORMING STEP USING METAL IONS | ETCHING PROCESS | ALKALINE ETCHING | CLEANING STEP |
| COMPARATIVE EXAMPLE | NaOH 3wt% | SILVER ION CONCENTRATION: $2 \times 10^{-4}$ [M] | MIXED ACID ETCHING $HNO_3 + HF + H_2O$ | NaOH 1wt% + HFdip | WITHOUT CLEANING |
| EXAMPLE 1 | | | | | $O_3$+NITRIC ACID |
| EXAMPLE 2 | | | | | $O_3$ |
| EXAMPLE 3 | | | | | $O_3$ BUBBLING |
| EXAMPLE 4 | | | | | $O_3$+$H_2O_2$ |
| EXAMPLE 5 | | | | | $O_3$+UV |
| EXAMPLE 6 | | | | | $O_3$+HCl |
| EXAMPLE 7 | | | | | $O_3$+US |
| EXAMPLE 8 | | | | | PRESSURIZATION→ $O_3$→ DEPRESSURIZATION |
| REFERENCE EXAMPLE 1 | | | | | HPM |
| REFERENCE EXAMPLE 2 | | | | | SPM |
| EXAMPLE 9 | | SILVER ION CONCENTRATION: $2 \times 10^{-5}$ [M] | | | $O_3$+NITRIC ACID |
| EXAMPLE 10 | | | | | $O_3$+HCl |
| REFERENCE EXAMPLE 3 | | | | | HPM |
| REFERENCE EXAMPLE 4 | | | | | SPM |

CLEANING METHOD OF SILICON SUBSTRATE AND MANUFACTURING METHOD OF SOLAR BATTERY

FIELD

The present invention relates to a cleaning method of a silicon substrate and a manufacturing method of a solar battery, and more particularly to a cleaning method of a silicon substrate having fine irregularities (texture) on a surface of the silicon substrate and a manufacturing method of a solar battery.

BACKGROUND

Conventionally, fine irregularities are formed on a surface of a solar battery so as to suppress surface reflection. These fine irregularities cause multiple reflection of incident light and allow the incident light to be efficiently absorbed into the solar battery. These fine irregularities are referred to as "texture".

Generally, in a monocrystalline silicon solar battery, pyramid texture (alkali texture) is formed by wet etching using an alkaline aqueous solution such as NaOH or KOH and IPA (isopropyl alcohol). Although being effective for a case where a substrate is constituted by one crystal plane such as a monocrystalline silicon substrate because this technique uses the difference in etching rate on a crystal plane, this technique is unable to sufficiently reduce reflectivity for a case where various crystal planes are present in a plane of such a substrate as a polycrystalline silicon substrate.

To solve this problem, there is proposed a method in which a porous layer is formed on a surface of a silicon substrate by immersing the silicon substrate in a metal-ion (metal catalyst)-containing mixed aqueous solution of an oxidizing agent and hydrofluoric acid, and the silicon substrate is then immersed in an alkaline aqueous solution, thereby forming texture (see, for example, Patent Literature 1). However, the method of Patent Literature 1 has a problem that it is difficult to obtain stable solar battery characteristics. As measures to solve this problem, there is proposed a method in which a silicon substrate on which a porous layer is formed by a metal-ion (metal-catalyst)-containing mixed aqueous solution of an oxidizing agent and hydrofluoric acid is immersed in mixed acid of hydrofluoric acid and nitric acid, thereby forming texture (see, for example, Patent Literature 2 and Non Patent Literature 1).

According to the methods of Patent Literature 2 and Non Patent Literature 1, metal precipitated on the silicon surface forms pores in the silicon substrate as if the metal acts like a drill, and the precipitated metal is present on bottoms of the pores. Because mixed acid that is a mixture of the hydrofluoric acid and the nitric acid is an isotropic etchant for silicon, a pore diameter can be increased uniformly in a depth direction and the precipitated metal on the bottoms of the pores can be partially removed.

Furthermore, Patent Literature 3 describes that impurities such as metal impurities on a surface of a silicon substrate can be removed by a combination and repetition of ozone water, washing, and a hydrofluoric acid treatment. Patent Literature 4 describes a substrate cleaning method of rinsing a surface of a substrate with ozone water after performing a chemical treatment on the surface of the substrate and further rising the surface of the substrate with pure water. Patent Literature 5 describes a method of removing metal impurities adhering to a surface of a silicon wafer by rinsing the silicon wafer with ozone water.

CITATION LIST

Patent Literatures

Patent Literature 1: Japanese Patent No. 3925867
Patent Literature 2: International Publication No. WO2009/054076
Patent Literature 3: Japanese Patent Application Laid-open No. 2006-269960
Patent Literature 4: Japanese Patent Application Laid-open No. 2001-327933
Patent Literature 5: Japanese Patent Application Laid-open No. 2007-73806

Non Patent Literature

Non Patent Literature 1: Kazuya Tsujino, Michio Matsumura, "Morphology of nanoholes formed in silicon by wet etching in solutions containing HF and H2O2 at different concentrations using silver nanoparticles as catalysts" Journal of Electrochimica Acta, No. 53 pp. 28-34 2007

SUMMARY

Technical Problem

However, the method of Patent Literature 2 mentioned above has the following problems. That is, if many silicon substrates are collectively processed, metal catalysts sometimes remain on bottoms of pores only by performing a mixed-acid immersion process after forming a porous layer. This disadvantageously influences on the solar battery characteristics. Furthermore, impurities such as metal impurities dissolved in a solution in the mixed-acid immersion process re-adhere to the surface of the silicon substrate. This also disadvantageously influences on the solar battery characteristics.

Further, differently from Patent Literatures 1 and 2, Patent Literature 3 does not describe cleaning of interiors of fine pores with air bubbles. Accordingly, even if the surface of the silicon substrate is to be cleaned by the method of Patent Literature 3, it is difficult to clean the surface of the silicon substrate and the interiors of the pores of the porous layer formed on the surface of the silicon substrate.

Further, differently from Patent Literatures 1 and 2, Patent Literatures 4 and 5 do not describe cleaning of interiors of fine pores with air bubbles. Accordingly, even if the surface of the silicon substrate is to be cleaned by the method of Patent Literature 4, it is difficult to clean the surface of the silicon substrate and the interiors of the pores of the porous layer formed on the surface of the silicon substrate.

The present invention has been achieved in view of the above problems, and an object of the present invention to provide a cleaning method of a silicon substrate capable of removing impurities such as metal impurities adhering to a surface of a silicon substrate on which texture is formed by using metal catalysts and to interiors of pores by a low-cost method, and to provide a manufacturing method of a solar battery using the cleaning method.

Solution to Problem

In order to solve the above problem and in order to attain the above object, a cleaning method of a silicon substrate regarding the present invention includes: a first step of etching a surface of a silicon substrate by a metal-ion-containing mixed aqueous solution of an oxidizing agent and hydrofluoric acid, and of forming a porous layer on the surface of the silicon substrate; a second step of etching a pore of the porous layer by mixed acid mainly containing hydrofluoric acid and nitric acid, and of forming texture on the surface of the silicon substrate; a third step of etching the surface of the silicon substrate on which the texture is formed by an alkaline chemical solution; and a fourth step of treating the silicon substrate etched by the alkaline chemical solution with ozone-containing water, of generating an air bubble within the pore formed in the silicon substrate, and of removing metal and organic impurities from within the pore.

Advantageous Effects of Invention

According to the present invention, it is possible to remove metal adhering to a surface of a silicon substrate on which texture is formed by using metal catalysts and to interiors of pores by a low-cost method, and to provide a solar battery with a high photoelectric conversion efficiency.

BRIEF DESCRIPTION OF DRAWINGS

FIG. 5 is a flowchart of steps of forming texture and cleaning a silicon substrate in a manufacturing method of a solar battery in a comparative example.

FIG. 6 depicts conditions for respective processing steps in the comparative example, Examples, and reference examples.

DESCRIPTION OF EMBODIMENTS

Figure 1:
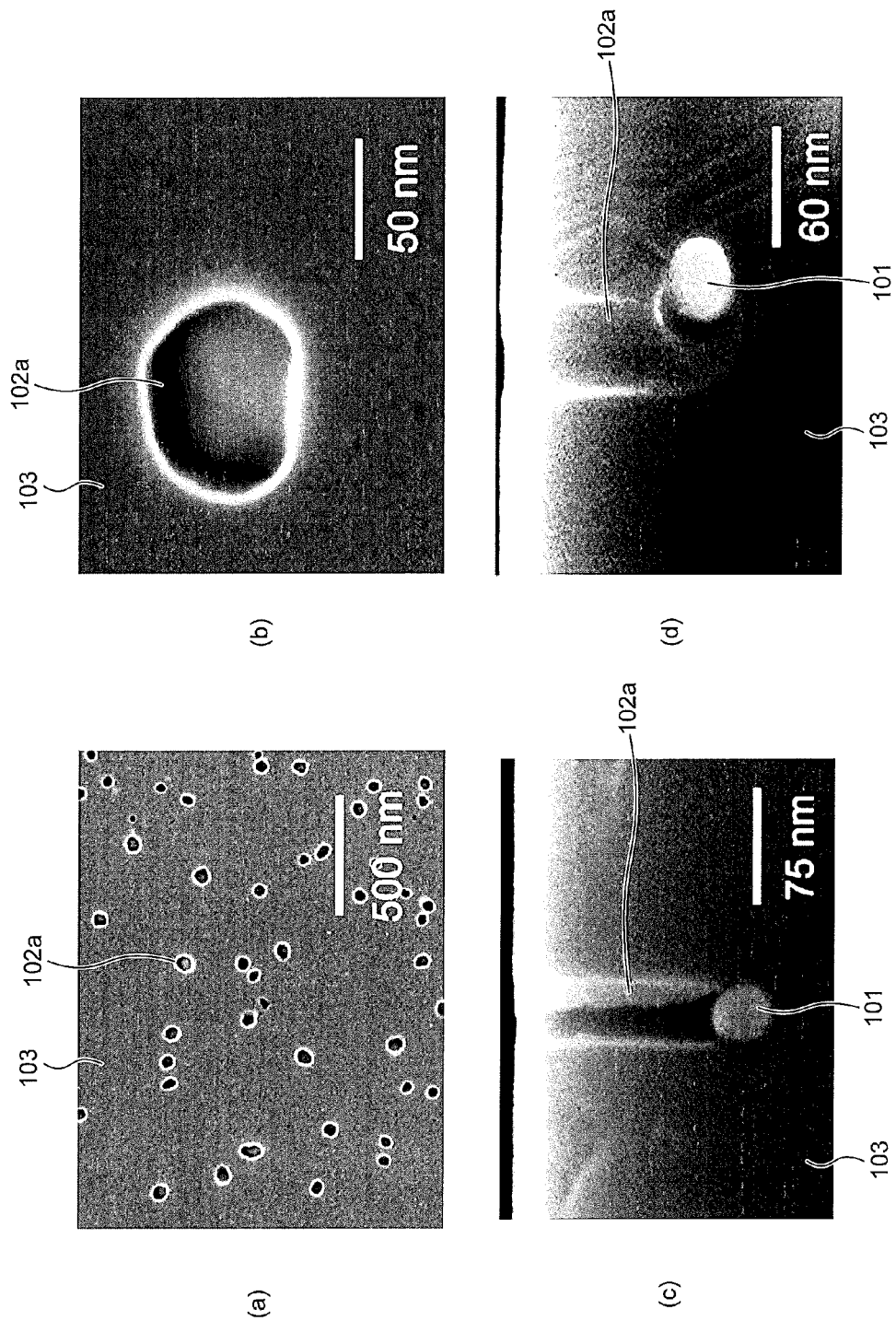
FIG. 1 are images of an SEM observation result of pores formed in a silicon substrate using metal catalysts.

Exemplary embodiments of a cleaning method of a silicon substrate and a manufacturing method of a solar battery according to the present invention will be explained below in detail with reference to the accompanying drawings. The present invention is not limited to the following descriptions and can be modified as appropriate without departing from the scope of the invention. In addition, in the drawings explained below, for easier understanding, scales of respective members may be different from those of actual products.

Embodiment

The present inventors conducted extensive studies of the method of Patent Literature 2 so as to obtain a solar battery with a high photoelectric conversion efficiency. FIG. 1 are an example of a state where pores are formed in a silicon substrate by using metal catalysts similarly to the method of Patent Literature 2. FIG. 1 are images of an SEM (Scanning Electron Microscope) observation result of pores 102a formed in a silicon substrate 103 using metal catalysts 101.

FIG. 1(a) is a plan view of a surface of the silicon substrate 103, FIG. 1(b) is an enlarged plan view of one of the pores 102a, FIG. 1(c) is a cross-sectional view of the pore 102a, and FIG. 1(d) is a cross-sectional view of the pore 102a having a bent interior (cited from Non Patent Literature 1).

Figure 2:
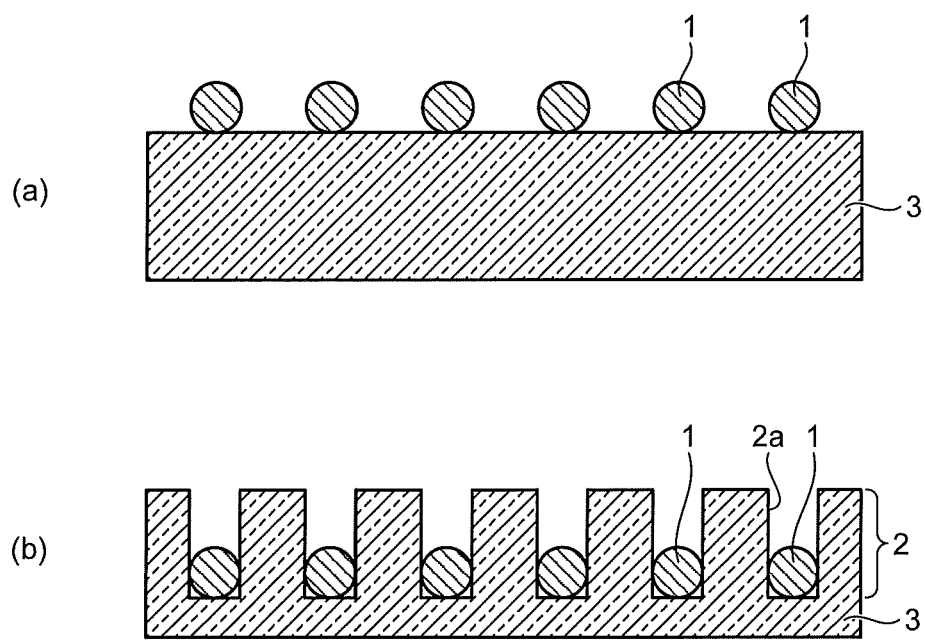
FIG. 2 are pattern diagrams for explaining a process of forming a porous layer on a surface of a silicon substrate using metal catalysts.

FIG. 2 are pattern diagrams for explaining a process of forming a porous layer on a surface of a silicon substrate using metal catalysts. When a silicon substrate 3 is immersed in a metal-ion-containing mixed aqueous solution of an oxidizing agent and hydrofluoric acid, metal catalysts 1 are precipitated on the silicon substrate 3 (FIG. 2(a)). Starting at these metal catalysts 1, the surface of the silicon substrate 3 is dissolved. Many pores 2a are formed in the surface of the silicon substrate 3, thereby forming a porous layer 2 (FIG. 2(b)). Thereafter, the silicon substrate 3 is immersed in mixed acid mainly containing hydrofluoric acid and nitric acid and the porous layer 2 is etched, thereby forming texture. At this time, some metal catalysts 1 on bottoms of the pores 2a are dissolved and removed and others are present within the pores 2a without being dissolved or molten metal is sometimes transformed into ions and the metal ions re-adhere to the silicon substrate 3. In an alkaline treatment as a next step, metal impurities present within the pores 2a are not removed but the metal ions dissolved from the surface of the silicon substrate 3 are re-precipitated by the alkaline treatment. This re-precipitation of the metal ions is considered to have an adverse effect on solar battery characteristics.

Therefore, it is necessary to perform a cleaning step of cleaning interiors of the pores 2a in the silicon substrate 3 and the surface of the silicon substrate 3 after forming the porous layer 2 so as to manufacture a solar battery having a high photoelectric conversion efficiency. A low-cost and effective cleaning method suited for the manufacturing of the solar battery on which texture is formed by using the metal catalysts is not realized yet.

Therefore, the present inventors conducted a study of the influence of the metal adhering to the surface of the silicon substrate on which the texture is formed and to the interiors of the pores. Table 1 shows an example of the solar battery characteristics depending on whether or not the silicon substrate is cleaned after forming the texture using the metal catalysts. A P-type polycrystalline silicon substrate (280-μm thick and 150-mm squares) was used as the silicon substrate, and the texture was formed in the following process flow.

First, a porous layer was formed by immersing the silicon substrate in a chemical solution of HF (50 wt %):$H_2O_2$ (30 wt %):$H_2O$:$AgNO_3$ (0.1 mol [M])=2:1:8 at a concentration of Ag ions [Ag+] of $2\times10^{-4}$ mole [M] at a room temperature for 3 minutes. Unnecessary substances were removed from the silicon substrate by washing the silicon substrate.

Next, the porous layer was etched by using the mixed acid solution mainly containing the hydrofluoric acid and the nitric acid to such an extent as not to eliminate a reflectivity reducing effect. The silicon substrate was immersed in the mixed acid solution of HF (50 wt %):$HNO_3$ (69 wt %):$H_2O$=1:9:15 (volume rate) at the room temperature for 3 minutes. Thereafter, the silicon substrate was immersed in an NaOH aqueous solution (1 wt %) at the room temperature for 10 seconds, and a stain film formed by distaining the surface of the silicon substrate after etching the porous layer by using the mixed acid solution was removed.

Next, unnecessary substances were removed from the silicon substrate by washing the silicon substrate. Using an HF aqueous solution of HF (50 wt %):$H_2O$=1:100 (volume ratio), an oxide film on the surface of the silicon substrate was removed.

At this point, steps of forming impurity diffused layers (forming pn junctions) by thermally diffusing n-impurities, forming an anti-reflection film on a light-receiving-surface-side surface of the silicon substrate, printing electrodes on and burning front and rear surfaces of the silicon substrate were executed to one silicon substrate, thereby manufacturing a solar battery cell.

Next, the present inventors cleaned another silicon substrate and conducted a study of the effect of substrate cleaning. The substrate was cleaned with HCl (36 wt %):$H_2O_2$ (30 wt %):$H_2O$=1:1:7 (volume rate) at 80° C. (so-called SC2 cleaning in RCA cleaning) for 3 minutes. Thereafter, using the silicon substrate, a solar battery cell was manufactured similarly to the above manner.

Furthermore, as a comparison, pyramid texture (alkaline texture) was formed on the silicon substrate by wet etching using an alkaline aqueous solution of NaOH and IPA, similarly to the above manner. Thereafter, using the silicon substrate, a solar battery cell was manufactured similarly to the above manner. As characteristics of these solar battery cells, open voltages Voc [V], short-circuit current densities Jsc [mA/cm$^2$], fill factors FF, and photoelectric conversion efficiencies [%] of these solar battery cells were compared. Table 1 shows a result of the comparison.

TABLE 1

|  | Voc [V] | Jsc [mA/cm$^2$] | FF | Photoelectric conversion efficiency [%] |
|---|---|---|---|---|
| Alkaline texture | 0.621 | 32.739 | 0.773 | 15.71 |
| Metal catalyst texture (without SC2 cleaning) | 0.618 | 33.899 | 0.763 | 16.00 |
| Metal catalyst texture (with SC2 cleaning) | 0.625 | 34.178 | 0.772 | 16.49 |

As is obvious from Table 1, the solar battery characteristics greatly differ depending on whether or not the substrate is cleaned, and it is not possible to manufacture a solar battery having a high photoelectric conversion efficiency without conducting the substrate cleaning step after forming the texture.

However, it is difficult to apply even the SC2 cleaning described above to the manufacturing process of solar batteries the production volume per day of which is far larger than that of LSI and the cost reduction of which is necessary. Therefore, the present inventors tried substrate cleaning by using hydrochloric acid as an alternative to the SC2 cleaning. That is, the present inventors manufactured a solar battery cell using a silicon substrate subjected to the substrate cleaning with the hydrochloric acid in place of the SC2 cleaning in a similar manner to that described above, and evaluated characteristics. Table 2 shows a result of the evaluation.

TABLE 2

|  | Voc [V] | Jsc [mA/cm$^2$] | FF | Photoelectric conversion efficiency [%] |
|---|---|---|---|---|
| Alkaline texture | 0.610 | 33.192 | 0.771 | 15.60 |
| Metal catalyst texture (with SC2 cleaning) | 0.614 | 33.840 | 0.764 | 15.89 |
| Metal catalyst texture (with HCl cleaning) | 0.605 | 33.381 | 0.756 | 15.29 |

As is obvious from Table 2, the substrate cleaning by using the hydrofluoric acid had no cleaning effect and was unable to expect satisfactory photoelectric conversion efficiency.

Therefore, the present inventors conducted a study of a low-cost cleaning method capable of sufficiently removing the metal from the silicon substrate on which the texture was formed by immersing the porous layer formed by the metal-ion-containing mixed aqueous solution of the oxidizing agent and the hydrofluoric acid in the mixed acid of the hydrofluoric acid and the nitric acid.

Figure 3:
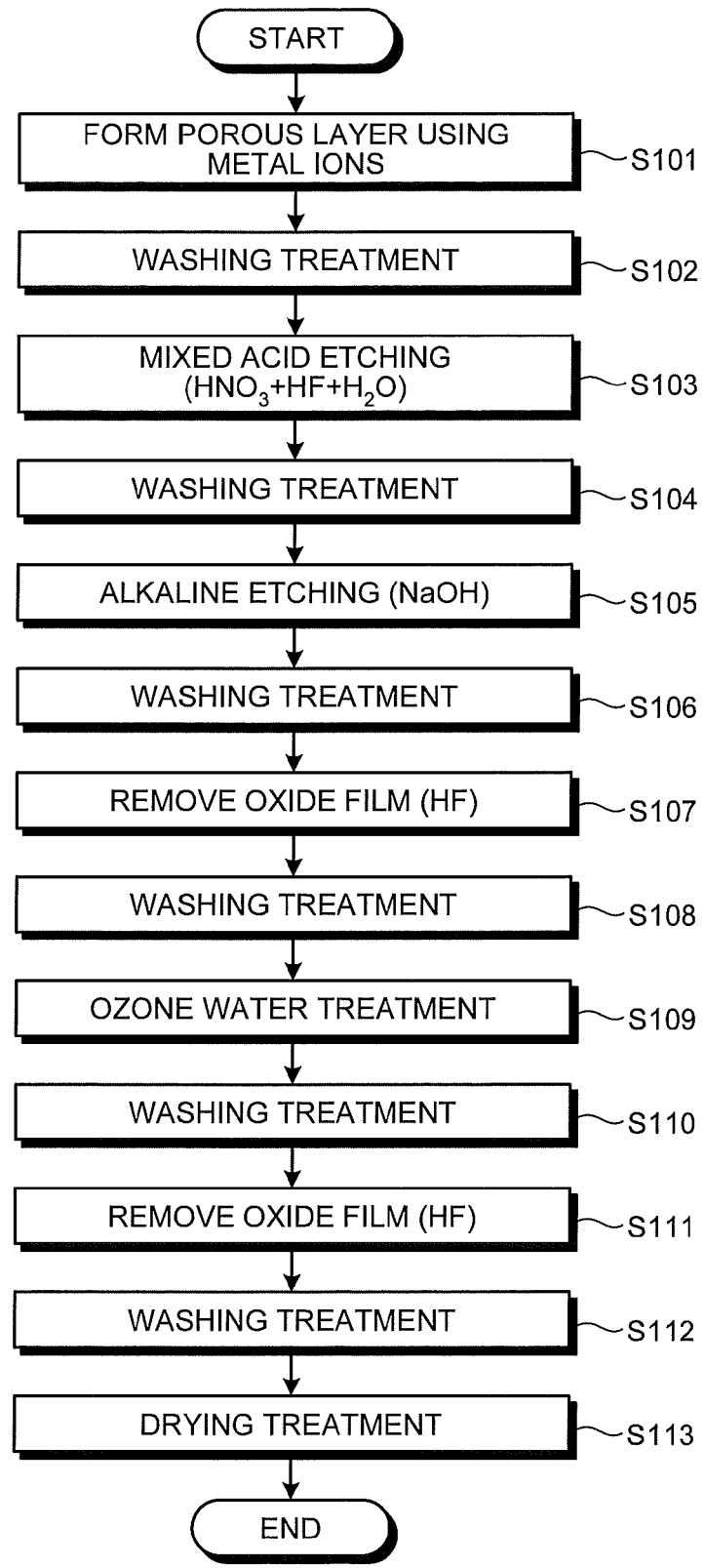
FIG. 3 is a flowchart of a texture forming step and a silicon-substrate cleaning step in a manufacturing method of a solar battery according to an embodiment of the present invention.

FIG. 3 is a flowchart of a texture forming step and a silicon-substrate cleaning step in the manufacturing method of a solar battery according to the present embodiment. The texture forming step and the silicon-substrate cleaning step in the manufacturing method of the solar battery are described below with reference to FIG. 3.

First, a silicon substrate is prepared. In this flow, a P-type polycrystalline silicon substrate is used. Slice damage done by a multi-wire saw remains on a surface of the silicon substrate. Accordingly, a damaged layer of the silicon substrate is removed by an alkaline solution such as 3 wt % of the NaOH aqueous solution.

Formation of a porous layer using metal ions (Step S101), a washing treatment (Step S102), etching by the mixed acid (nitric acid (hereinafter, also "$HNO_3$")+hydrofluoric acid (hereinafter, also "HF")+water ($H_2O$)) (Step S103), a washing treatment (Step S104), alkaline etching (Step S105), a washing treatment (Step S106), removal of an oxide film (HF treatment) (Step S107), a washing treatment (Step S108), an ozone water treatment (Step S109), a washing treatment (Step S110), removal of an oxide film (HF treatment) (Step S111), a washing treatment (Step S112), and a drying treatment (Step S113) are sequentially executed to such a silicon substrate.

At Step S101, the porous layer is formed on the surface of the silicon substrate by immersing the silicon substrate in the metal-ion (metal-catalyst)-containing mixed aqueous solution of the oxidizing agent and the hydrofluoric acid and etching the surface of the silicon substrate. At Step S101, one of silver, copper, nickel, platinum, palladium, and gold ions or a combination thereof can be used as the metal ions, and one of hydrogen peroxide, oxygen, and ozone or a combination thereof can be used as the oxidizing agent.

In the present embodiment, silver nitrate ($AgNO_3$) is used as a metal ion source, and hydrogen peroxide ($H_2O_2$) is used as the oxidizing agent. It is preferable that a concentration of silver used in the silver nitrate ($AgNO_3$) is at least equal to or higher than $2 \times 10^{-5}$ mole [M]. If the silver concentration is low, then pores formed at the time of forming the porous layer tend to have irregular depths, the pores formed in the silicon substrate are also small, and it is not possible to effectively reduce the reflectivity of the substrate surface in the later mixed acid treatment. The reason is as follows. To obtain the reflectivity reducing effect, it is necessary to perform mixed acid etching in conformity to the shallow pores so as not to excessively flatten the shallow pores. However, this etching is unable to remove the metal present on bottoms of deeper pores. As a result, the metal remains in the silicon substrate and adversely influences on the solar battery. It is also preferable that the concentration of silver used in the silver nitrate ($AgNO_3$) is lower than $8 \times 10^{-4}$ mole [M] for the following reason. If the silver concentration is high, then the pores are coupled together to increase a pore diameter, and the texture to be formed becomes large in size. Causes for the low reflectivity of the texture formed by using the metal catalysts possibly include the fact that the size of the texture is as small as sub-microns or less, and that this small texture acts as sub-wavelength grating. Accordingly, from viewpoints of the reflectivity, it is not preferable that the pore diameter of the porous layer is excessively large.

To form the porous layer, the silicon substrate is immersed in the mixed aqueous solution of, for example, HF (50 wt %):$H_2O_2$ (30 wt %):$H_2O$:$AgNO_3$ (0.1 M aqueous solution)=400 ml:200 ml:1600 ml:4.4 ml (volume rate) at the room temperature for 3 minutes. While the silicon substrate is immersed in the mixed aqueous solution in this flow, a treatment type is not limited to the immersion as long as the porous layer can be formed.

Furthermore, the diameter of the pores formed at Step S101 is preferably equal to or larger than 20 nanometers. If the pore diameter is smaller than 20 nanometers, this makes it difficult for a cleaning treatment liquid such as the ozone water to enter into the pores during the cleaning treatment executed at Step S109.

At the time of the cleaning treatment, as the pore diameter is larger, it is easier to pour the cleaning treatment liquid such as the ozone water into the pores. However, in this case, the texture to be formed becomes larger in size. Causes for the low reflectivity of the texture formed by using the metal catalysts possibly include the fact that the size of the texture is as small as sub-microns or less, and that this small texture acts as the sub-wavelength grating. Accordingly, from viewpoints of the reflectivity, it is not preferable that the pore diameter of the porous layer is excessively large and it is preferable that the pore diameter is equal to or smaller than 1 micrometer at most.

At Step S102, unnecessary substances used at Step S101 are removed from the silicon substrate by performing the washing treatment on the silicon substrate.

At Step S103, the porous layer is etched by using the mixed acid mainly containing the hydrofluoric acid and the nitric acid to such an extent as not to eliminate the reflectivity reducing effect. For example, the silicon substrate is immersed in the mixed acid of HF (50 wt %):$HNO_3$ (69 wt %):$H_2O$=1:9:15 (volume rate) at the room temperature for 3 minutes.

At Step S104, unnecessary substances used at Step S103 are removed from the silicon substrate by performing the washing treatment on the silicon substrate.

At Step S105, a stain film formed by distaining the surface of the silicon substrate after etching the silicon substrate by using the mixed acid at Step S103 is removed. In the present embodiment, the silicon substrate is immersed in the NaOH aqueous solution (3 wt %) at the room temperature for 10 seconds. Alternatively, an alkaline chemical solution using KOH or the like can be used in place of the NaOH aqueous solution.

At Step S106, unnecessary substances used at Step S105 are removed from the silicon substrate by performing the washing treatment on the silicon substrate.

At Step S107, the oxide film on the surface of the silicon substrate formed at Steps S101, S103, and S105 is removed by using the HF aqueous solution or a mixture of the HF aqueous solution and hydrogen peroxide ($H_2O_2$).

At Step S108, unnecessary substances used at Step S107 are removed from the silicon substrate by performing the washing treatment on the silicon substrate.

At Step S109, the silicon substrate is immersed in the ozone water, whereby the impurities such as the metal catalysts present on the bottoms of the pores formed in the silicon substrate at Step S103 and the metal re-adhering at Step S105 can be removed effectively and efficiently.

Figure 4:
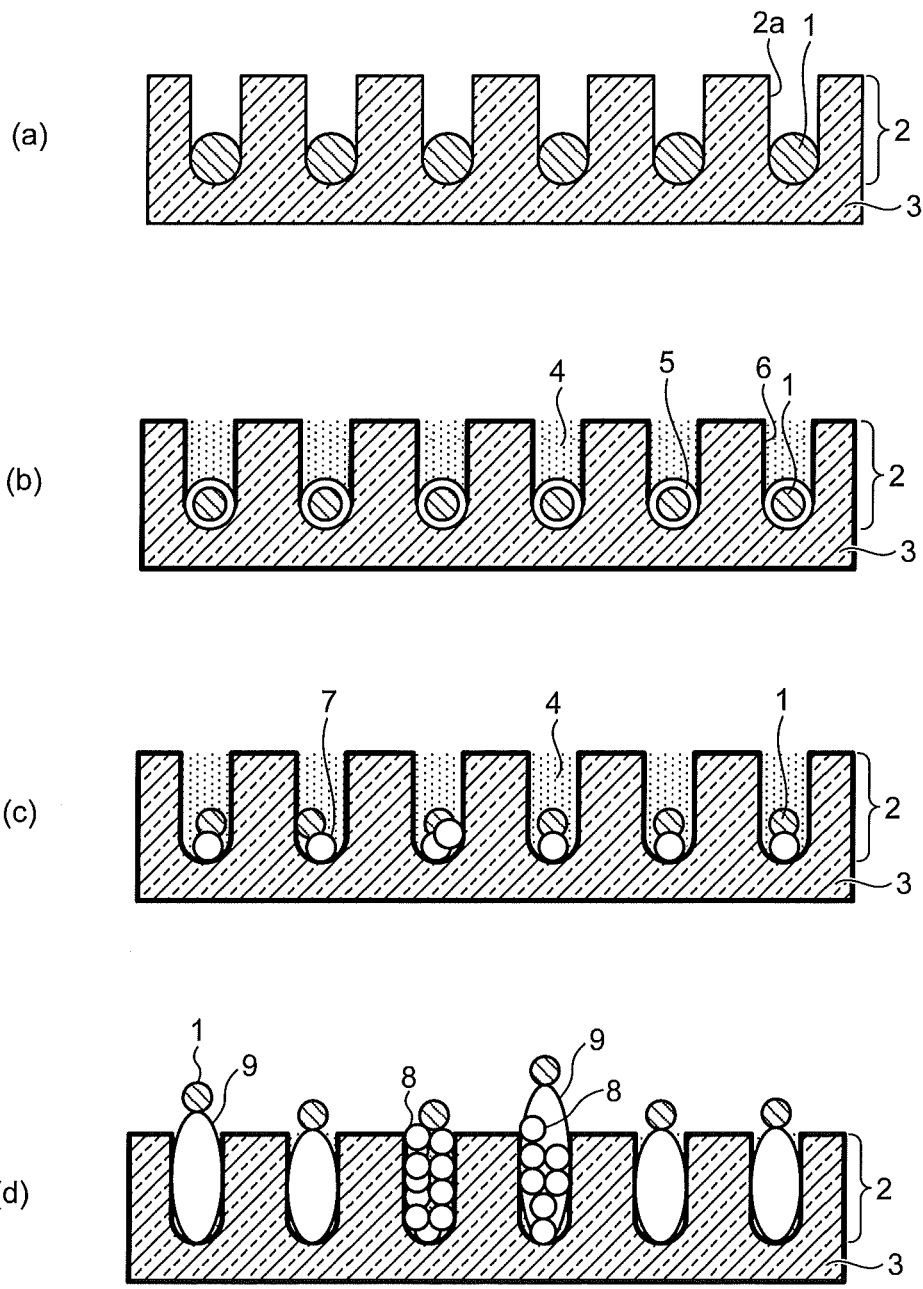
FIG. 4 are cross-sectional pattern diagrams for explaining a process of removing metal catalysts within a porous layer by ozone water cleaning in the embodiment of the present invention.

FIG. 4 are cross-sectional pattern diagrams for explaining a process of removing the metal catalysts 1 within a porous layer by ozone water cleaning. The metal catalysts 1 are present on the bottoms of the respective pores 2a of the porous layer 2 formed in the silicon substrate 3 (FIG. 4(a)). In the present embodiment, this silicon substrate 3 is cleaned by ozone water 4. By cleaning the silicon substrate 3 by the ozone water 4, the ozone water 4 ionizes and oxidizes regions of surface layers at a depth of about 1 to 5 nanometers of the metal catalysts 1 on the bottoms of the respective pores 2a formed in the silicon substrate 3. Gaps 5 obtained by oxidizing and ionizing the metal catalysts are thereby formed.

Furthermore, the ozone water 4 makes the surface of the silicon substrate 3 hydrophilic, thereby forming a hydrophilic surface 6 out of the silicon substrate 3 (FIG. 4(b)). Because of the high hydrophilicity of the surface 6 obtained by making the silicon substrate 3 hydrophilic, a cleaning liquid (the ozone water 4) can easily enter into fine gaps such as the pores 2a. Accordingly, a reaction that occurs between the ozone water 4 and the metal catalysts 1 or a reaction among the ozone water 4, the metal catalysts 1, and metal silicon (Si) (the silicon substrate 3) decomposes ozone into oxygen to generate an air bubble 7 within each of the pores 2a (FIG. 4(c)). The air bubble 7 pushes out the metal impurities within the pore 2a and removes the metal impurities from within the pore 2a. The air bubble 7 grows to generate a larger air bubble 9 within each pore 2a, the larger air bubble 9 pushes out the metal impurities within the pore 2a and removes the metal impurities from within the pore 2a. Alternatively, the above-described reaction generates small air bubbles 8 within each pore 2a, the small air bubbles 8 grow into the large air bubble 9, the large air bubble 9 is generated within the pore 2a, and the large air bubble 9 pushes out the metal impurities within the pore 2a and removes the metal impurities from within the pore 2a. Alternatively, the small air bubbles 8 are generated and aggregated within each pore 2a, the aggregated air bubbles 8 push out the metal impurities within the pore 2a and remove the metal impurities from within the pore 2a (FIG. 4(d)).

These air bubbles push up the impurities such as the metal catalysts from the bottoms of the pores 2a and appear in the cleaning liquid such as the ozone water 4 together with the impurities such as the metal impurities. Furthermore, the oxidizing power of the ozone contained in the ozone water 4 oxidizes and ionizes the metal impurities present in the ozone water 4 and those adhering to the surface of the silicon substrate 3, and the metal impurities are dissolved in the ozone water 4, thereby making it possible to remove the metal from the silicon substrate 3.

At this time, it is preferable that an ozone concentration of the ozone water 4 is in a range from 0.1 ppm to 150 ppm, and that the time of immersing the silicon substrate 3 in the ozone water is in a range from 1 second to 6 seconds. This is because the impurities such as the metal catalysts on the bottoms of the pores 2a formed in the silicon substrate 3 and the reaction between the metal catalysts and the silicon make it difficult to generate the air bubbles if the ozone concentration is lower than 0.1 ppm. Furthermore, even if the silicon substrate 3 is immersed in the ozone water in an ozone-water temperature condition higher than 150 ppm and in the above time condition, a thickness of the oxide film formed on the surface of the silicon substrate 3 by an oxidization reaction of the ozone saturates. Accordingly, even if a silicon-substrate cleaning treatment is conducted in conditions of the concentration and the time higher than those described above, the cleaning effect saturates and the cleaning effect hardly changes thereafter.

As described above, the present inventors found out that the metal impurities within the pores 2a can be effectively removed by generating the air bubbles within the pores 2a formed in the silicon substrate 3 by cleaning the silicon substrate 3 by the ozone water after the texture forming treatment by using the metal ions.

That is, the present inventors developed a cleaning method capable of effectively removing the metal catalysts precipitated within the complicated porous layer disclosed in Patent Literature 2. The cleaning method according to the present embodiment is a novel cleaning method of effectively removing the metal impurities from within the pores formed in the silicon substrate by the air bubbles generated by the reaction between the metal catalysts and the ozone water and the reaction among the metal catalysts, the silicon, and the ozone water that are not mechanisms easily known by analogy from a combination of Patent Literatures 2 and 3 as a novel effect that is beyond only a removing effect by removing metal and organic impurities based on a liftoff effect by treatments of forming the oxide film on a wafer surface and removing the oxide film, oxidization and ionization of the metal impurities, and decomposition of the organic impurities.

At Step S110, unnecessary substances used at Step S109 are removed form the silicon substrate by performing the washing treatment on the silicon substrate.

At Step S111, the oxide film on the surface of the silicon substrate formed at Step S109 is removed by using the HF aqueous solution or the mixture of the HF aqueous solution and the hydrogen peroxide. At this time, it is preferable to adjust an HF concentration or treatment time in proportion to a thickness of the oxide film. That is, if the oxide film is thick, it is preferable that the HF concentration is set high or that the treatment time is set long. Conversely, if the oxide film is thin, it is preferable that the HF concentration is set low or that the treatment time is set short. This is because the metal contained in the chemical solution re-adheres to the silicon substrate even after the oxide film on the silicon substrate is removed by the HF aqueous solution and a silicon surface is exposed. Although such a metal re-adhesion problem does not occur when EL grade chemicals and pure water are used, the metal re-adhesion problem occurs when low-impurity chemicals and low-impurity water are used.

At Step S111, the metal that is not ionized and oxidized, organic substances that are not decomposed, and the like at Step S109 can be removed by liftoff at the time of removing the oxide film formed on the surface of the silicon substrate by the HF aqueous solution or the like at Step S109.

At Step S112, unnecessary substances used at Step S111 are removed from the silicon substrate by performing the washing treatment on the silicon substrate.

Thereafter, Steps S109 to S112 are repeated at least once, thereby making it possible to further effectively remove the metal that re-adheres to the silicon substrate and the metal that remains within the porous layer.

At Step S113, the silicon substrate is dried and texture formation and cleaning of the silicon substrate are completed. Thereafter, steps of forming impurity diffusion layers (forming pn junctions) by thermal diffusion of n-impurities on the silicon substrate, forming an anti-reflection film on the light-receiving-surface-side surface of the silicon substrate, and printing electrodes on and burning front and rear surfaces of the silicon substrate are executed to the silicon substrate, thereby manufacturing a solar battery.

At Step S109 described above, it is preferable to use nitrogen or the air in addition to oxygen as materials of ozone gas used at the time of generating the ozone water. Nitric acid is produced from the nitrogen contained in the ozone material gas and this nitric acid is contained in the ozone water. This can suppress self-decomposition of ozone to stabilize the ozone, and can further promote a metal dissolving effect. It is thereby possible to effectively remove the metal adhering to the silicon substrate.

The nitric acid alone can be expected to exhibit the metal dissolving effect as long as the nitric acid has a concentration as high as several tens of wt %. However, the nitric acid in the ozone gas even in a small amount can greatly increase a metal removing effect if being used together with the ozone. The concentration of the nitric acid in the ozone gas is several ppm at the highest and the nitric acid of this concentration alone has no metal removing effect.

Furthermore, at Step S109, the ozone gas can be bubbled into the pure water in which the silicon substrate is immersed instead of immersing the silicon substrate in the ozone water produced in advance. Bubbling the ozone gas into the pure water in which the silicon substrate is immersed can promote the metal removing effect of removing the metal from the surface of the silicon substrate. That is, by bubbling the ozone gas, ozone is dissolved in the water, the ozone water is produced, and the ozone water removes the metal. By adding a bubble oscillating effect and a removing effect of removing foreign matters including the metal besides the metal removing effect, it is possible to remove the metal adhering to the surface of the silicon substrate more effectively. It is also possible to further bubble the ozone gas into the ozone water.

Further, at Step S109, the silicon substrate 3 is immersed in the ozone water 4 to cause the ozone water 4 to enter into the pores 2a. A diameter of the metal catalyst 1 such as Ag entering into each pore 2a is about 20 to 100 nanometers, and the ozone water 4 can ionize and oxidize the region at the depth of about 1 to 5 nanometers of the surface of the metal catalyst 1 such as Ag within the pore 2a. Accordingly, the gap is formed between the metal catalyst 1 such as Ag and the silicon substrate (Si) within the pore 2a, which further facilitates pushing out the metal catalyst 1 such as Ag into the cleaning liquid such as the ozone water by the air bubbles.

Furthermore, at Step S109, the ozone water 4 has a better effect of making the surface of the silicon substrate hydrophilic and can easily enter into the pores 2a, thus further improving the cleaning effect.

At Step S109, ultrasonic waves can be irradiated to the ozone water 4 while immersing the silicon substrate 3 in the ozone water 4. This causes cavitation and thereby generates air bubbles in the ozone water 4. By further irradiating ultrasonic waves to the ozone water 4, the generated air bubbles are crushed. Such irradiation of the ultrasonic waves to the ozone water 4 improves the air-bubble generation efficiency in the ozone water 4 within the pores 2a formed in the silicon substrate 3 and improves the cleaning effect. It is preferable that the ultrasonic waves to be used have a frequency of 10 to 1000 kilohertz. In this case, the air bubbles can be generated in the water in which the ultrasonic waves and the gas are dissolved. However, if the gas does not have the oxidizing power similarly to that of the ozone water, the cleaning effect is low because it is not possible to remove the metal impurities on the surface of the silicon substrate.

Furthermore, at Step S109, when cleaning the silicon substrate 3, the ozone water 4 can be produced by pressurizing and dissolving the ozone gas in the pure water, and a treatment of reducing the pressure of the ozone water 4 and generating air bubbles in a state where the silicon substrate 3 is immersed in this ozone water 4 or the like can be performed. In this case, because pressurization and depressurization function to efficiently generate the air bubbles in the ozone water 4, the metal impurities on the bottoms of the pores 2a formed in the silicon substrate 3 can be effectively removed. Alternatively, the pressure of the ozone water 4 can be reduced in the state where the silicon substrate 3 is immersed in the ozone water 4.

Even if the cleaning treatment is performed on the silicon substrate by using the pure water containing hydrogen peroxide, oxygen, nitrogen, and the like, it is not possible to effectively remove the metal impurities adhering to the silicon substrate for the following reasons. The treatment liquid having low oxidizing power is unable to ionize and oxidize particle surfaces of the metal catalysts such as Ag, and hardly has the effect of ionizing the metal impurities on the surface of the silicon substrate.

Therefore, it is preferable to perform the cleaning treatment on the silicon substrate 3 using the pure water containing the gas having the oxidizing power and the cleaning liquid in which the gas is dissolved and which has the oxidizing power.

When bubbling the ozone gas in the ozone water or the pure water as described above, hydrogen peroxide can be added. By adding the hydrogen peroxide to the ozone gas, OH radicals far higher in the oxidizing power than the ozone are generated and it is possible to remove the metal re-adhering to the surface of the silicon substrate more effectively by oxidizing metal with these OH radicals. However, it is necessary to adjust an amount of the added hydrogen peroxide so as to be able to keep the concentration of the ozone water necessary to generate the air bubbles from the ozone water because the hydrogen peroxide reacts with the ozone water to decompose the ozone and the hydrogen peroxide.

Furthermore, in the present embodiment, the silver nitrate ($AgNO_3$) is used as a metal ion source and the hydrogen peroxide ($H_2O_2$) is used as the oxidizing agent as described above. As a result of the study conducted by the present inventors, it was confirmed as follows as for the concentration of silver used in the silver nitrate ($AgNO_3$). If the silver concentration is low, the pores formed at the time of forming the porous layer tend to have irregular depths; however, the ozone water cleaning effect can be expected even if a concentration of silver ions is equal to or higher than $2 \times 10^{-5}$ mole [M].

The reason that even the ozone water containing silver having such a low concentration has the ozone water cleaning effect is as follows. Because of the low viscosity of the ozone water, the ozone water can enter into the pores 2a formed in the silicon substrate 3. In addition, the ozone water cleaning and the metal catalysts such as silver or the metal catalysts and silicon (Si) function to generate the air bubbles within the pores. Therefore, it is possible to effectively remove the metal catalysts 1 such as silver within the pores 2a by the ozone water cleaning at Step S109. That is, if the silver concentration is low, then the pores 2a formed at the time of forming the porous layer 2 tend to have irregular depths, and it is difficult to dissolve the metal on the bottoms of the pores 2a in the subsequent mixed acid treatment. However, in the ozone water treatment according to the present embodiment, the air bubbles generated within the pores push up the metal catalysts 1 on the bottoms of the pores 2a to press out the impurities such as the metal impurities into the ozone water 4 at Step S109.

In the treatment disclosed in Patent Literature 2, the silver ion concentration needs to be equal to or higher than $1 \times 10^{-4}$ mole [M]. On the other hand, in the present embodiment, even with the silver ion concentration of $2 \times 10^{-5}$ mole [M] lower than that disclosed in Patent Literature 2, it is possible to reduce the reflectivity on the wafer surface without degrading the solar battery cell characteristics. As a result, it is possible to reduce the amount of silver to be used and to realize treatment cost reduction.

Furthermore, when the ozone gas is bubbled into the ozone water or the pure water as described above, ultraviolet rays at a wavelength near 254 nanometers can be irradiated on the ozone water or the pure water. By irradiating the ultraviolet rays, OH radicals far higher in the oxidizing power than the ozone are generated and it is possible to remove the metal adhering to the surface of the silicon substrate more effectively by oxidizing the metal with these OH radicals.

However, it is necessary to adjust an ultraviolet irradiation time so as to be able to keep the concentration of the ozone water necessary to generate the air bubbles because the ozone is decomposed when the OH radicals are generated.

Furthermore, when it suffices to perform only the treatment of removing the metal impurities from the surface of the silicon substrate, only the pure water can effectively remove the metal adhering to the surface of the silicon substrate without using the ozone water or the ozone gas by setting the wavelength of the ultraviolet rays to be near 185 nanometers.

Addition of the hydrogen peroxide and the ultraviolet irradiation can be combined at the time of performing the bubbling, the ultrasonic wave treatment, the pressurization and depressurization treatments.

At Step S109, the hydrochloric acid or the sulfuric acid can be added to the ozone water. By adding the hydrochloric acid or the sulfuric acid, the ozone water becomes acidic, the ozone concentration is stabilized, and the effect of removing them metal adhering to the silicon substrate is stabilized. However, it is preferable to set an amount of the chemical solution such as the hydrochloric acid or the sulfuric acid to be added to the ozone water to about 0.1 wt % to 3 wt % so as not to affect the viscosity of the treatment liquid (ozone water).

The reason for adjusting the amount of the chemical solution such as the hydrochloric acid or the sulfuric acid to be added to the ozone water is as follows. If the viscosity of the treatment liquid is higher at Step S109, it is more difficult for the treatment liquid (ozone water) to enter into the pores 2a formed in the silicon substrate 3, and therefore it is not possible to efficiently remove the metal impurities within the pores 2a formed in the silicon substrate 3.

Because both a mixed solution of the ozone water and the hydrochloric acid and that of the ozone water and the sulfuric acid have acidic pHs, the decomposition of the ozone becomes slow. Therefore, it is difficult to generate air bubbles in the treatment liquid, and possible to generate the air bubbles by the reaction between the ozone water 4 and the metal catalysts 1 and that among the metal catalysts 1, the silicon, and the ozone water 4. Accordingly, it is possible to achieve an effect equal to or greater than that achieved by the treatment of cleaning the silicon substrate using only the ozone water.

At Step S109, the ozone gas can be constantly supplied while the silicon substrate contacts the ozone water. It is thereby possible to continuously supply the ozone consumed by a metal oxidization reaction and to stably remove the metal from the silicon substrate. Further, by making the air bubbles of the supplied ozone gas small in diameter using, for example, an injector, the ozone dissolution efficiency is improved and the air bubbles can remove foreign matters on the surface of the silicon substrate. The metal adhering to the silicon substrate can be removed more effectively with the addition of the improved ozone dissolution efficiency and the effect of removing the foreign matters.

The water ($H_2O$) used at the steps described above is not limited to the pure water or super-pure water but functional water such as anode water, cathode water, or hydrogen water can be used as the water used at the steps.

As described above, according to the present embodiment, the ozone can ionize and remove the metal adhering to the surface of the silicon substrate. Similarly, the ozone can ionize and remove the metal in the form of particles and remaining in the porous layer having a complicated surface shape. According to the present embodiment, the air bubbles generated within the pores can push out the impurities such as the metal catalysts on the bottoms of the pores formed in the silicon substrate onto the surface of the silicon substrate, and can ionize and remove the impurities together with the metal impurities adhering to the surface. Accordingly, it is possible to manufacture the solar battery having high solar battery characteristics without degradation in crystal quality by metal contamination at the steps of manufacturing the solar battery. Because of no need to use the chemical solution such as an acid solution, a chemical solution cost is low and there is no need to prepare a large and complicated effluent treatment facility.

The methods described above can be appropriately combined in a scope in which no problem occurs in the cleaning of silicon substrates.

Solar batteries in Examples 1 to 10 manufactured according to the above embodiment, a solar battery in a comparative example manufactured according to a conventional method, and solar batteries in reference examples 1 to 4 manufactured by using the SC2 cleaning in the RCA cleaning or SPM cleaning are described next, so as to validate the effects of the manufacturing method of the solar battery according to the present embodiment. In each of the Examples 1 to 10, the comparative example, and the reference examples 1 to 4, a P-type polycrystalline silicon substrate having a specific resistance of 3 Ω·cm and 156-mm squares was used.

FIG. 5 is a flowchart of steps of forming texture and cleaning a silicon substrate in a manufacturing method of a solar battery in the comparative example. In the manufacturing of the solar battery in the comparative example, formation of a porous layer using metal ions (Step S201), a washing treatment (Step S202), etching by the mixed acid (nitric acid ($HNO_3$)+hydrofluoric acid (HF)+water ($H_2O$)) (Step S203), a washing treatment (Step S204), an alkaline treatment (Step S205), a washing treatment (Step S206), removal of an oxide film (HF treatment) (Step S207), a washing treatment (Step S208), and a drying treatment (Step S209) were sequentially executed to a P-type silicon substrate from which a damage layer was removed by 3 wt % of the NaOH aqueous solution in advance and which had 156-mm squares.

Specifically, at Step S201, the porous layer was formed by immersing the silicon substrate in the mixed aqueous solution of HF (50 wt %):$H_2O_2$ (30 wt %):$H_2O$:$AgNO_3$ (0.1 M)=400 ml:200 ml:1600 ml:4.4 ml ([Ag+]=$2\times10^{-4}$ [M]) at the room temperature for 3 minutes.

At Step S202, unnecessary substances used at Step S201 were removed from the silicon substrate by performing the washing treatment on the silicon substrate.

At Step S203, the porous layer was etched by using the mixed acid solution mainly containing the hydrofluoric acid and the nitric acid to such an extent as not to eliminate the reflectivity reducing effect. In the comparative example, the silicon substrate was immersed in the mixed acid of HF (50 wt %):$HNO_3$ (69 wt %):$H_2O$=1:9:15 (volume rate) at the room temperature for 3 minutes.

At Step S204, unnecessary substances used at Step S203 were removed from the silicon substrate by performing the washing treatment on the silicon substrate.

At Step S205, a stain film formed by distaining the surface of the silicon substrate after etching the silicon substrate by using the mixed acid solution at Step S203 was removed. In the comparative example, the silicon substrate was immersed in 1 w % of the NaOH aqueous solution at the room temperature for 10 seconds.

At Step S206, unnecessary substances used at Step S205 were removed from the silicon substrate by performing the washing treatment on the silicon substrate.

At Step S207, the oxide films on the surface of the silicon substrate formed at Steps S201, S203, and S205 were removed by using the HF aqueous solution of HF (50 wt %):$H_2O$=1:100 (volume ratio).

At Step S208, unnecessary substances used at Step S207 were removed from the silicon substrate by performing the washing treatment on the silicon substrate.

At Step S209, the silicon substrate was dried and texture formation and cleaning of the silicon substrate were completed. Thereafter, after executing steps of forming pn junctions by thermal diffusion of n-impurities on the silicon substrate, forming an anti-reflection film on the light-receiving-surface-side surface of the silicon substrate, and printing electrodes on and burning front and rear surfaces of the silicon substrate, the solar battery was manufactured in the comparative example.

The solar batteries in the Examples 1 to 10 were manufactured each by processing a p-type silicon substrate from which a damage layer was removed by 3 wt % of the NaOH aqueous solution in advance and which had 156-mm squares according to the steps shown in the flowchart shown in FIG. 3. The solar batteries in the reference examples 1 to 4 were manufactured each by processing a p-type silicon substrate from which a damage layer was removed by 3 wt % of the NaOH aqueous solution in advance and which had 156-mm squares according to the steps shown in the flowchart shown in FIG. 3 except for executing the SC2 cleaning in the RAC cleaning or the SPM cleaning in place of Step S109.

Specifically, at Step S101 in each of the Examples 1 to 8 and the reference examples 1 and 2, the silicon substrate was immersed in the mixed aqueous solution of HF (50 wt %):$H_2O_2$ (30 wt %):$H_2O$:$AgNO_3$ (0.1 M)=400 ml:200 ml:1600 ml:4.4 ml [Ag+]=$2\times10^{-4}$ mole [M]) at the room temperature for 3 minutes.

Furthermore, at Step S101 in each of the Examples 9 and 10 and the reference examples 3 and 4, the silicon substrate was immersed in the mixed aqueous solution of HF (50 wt %):$H_2O_2$ (30 wt %):$H_2O$:$AgNO_3$ (0.1 M)=400 ml:200 ml:1600 ml:4.4 ml [Ag+]=$2\times10^{-5}$ mole [M]) at the room temperature for 3 minutes.

At Step S102, unnecessary substances used at Step S101 were removed from the silicon substrate by performing the washing treatment on the silicon substrate.

At Step S103, the porous layer was etched by using the mixed acid solution of HF (50 wt %):$HNO_3$ (69 wt %):$H_2O$=1:9:15 (volume rate) at the room temperature for 3 minutes.

At Step S104, unnecessary substances used at Step S103 were removed from the silicon substrate by performing the washing treatment on the silicon substrate.

At Step S105, a stain film formed by distaining the surface of the silicon substrate after etching the silicon substrate by using the mixed acid solution at Step S103 was removed. In these examples, the silicon substrate was immersed in 1 wt % of the NaOH aqueous solution at the room temperature for 10 seconds.

At Step S106, unnecessary substances used at Step S105 were removed from the silicon substrate by performing the washing treatment on the silicon substrate.

At Step S107, the oxide films on the surface of the silicon substrate formed at Steps S101, S103, and S105 were removed by using the HF aqueous solution of HF (50 wt %):$H_2O$=1:100 (volume ratio).

At Step S108, unnecessary substances used at Step S107 were removed from the silicon substrate by performing the washing treatment on the silicon substrate.

As for the solar battery in the Example 1, at Step S109, the ozone water treatment was executed by immersing the silicon substrate in the ozone water having a concentration of 5 ppm at the room temperature for 3 minutes. At the time of producing the ozone water, a combination of oxygen and nitrogen were used as the material of the ozone gas. Processes at Step S109 of manufacturing the other solar batteries are described later.

At Step S110, unnecessary substances used at Step S109 were removed form the silicon substrate by performing the washing treatment on the silicon substrate.

At Step S111, the oxide film on the surface of the silicon substrate formed at Step S109 was removed by using the HF aqueous solution of HF (50 wt %):$H_2O$=1:100 (volume ratio).

At Step S112, unnecessary substances used at Step S111 were removed from the silicon substrate by performing the washing treatment on the silicon substrate.

At Step S113, the silicon substrate was dried and texture formation and cleaning of the silicon substrate were completed. Thereafter, after executing steps of forming pn junctions by thermal diffusion of n-impurities on the silicon substrate, forming an anti-reflection film on the light-receiving-surface-side surface of the silicon substrate, and printing electrodes on and burning front and rear surfaces of the silicon substrate, the solar battery was manufactured in each of the Examples 1 to 8 and the reference examples 1 to 4.

The solar battery in the Example 2 was manufactured similarly to that in the Example 1 except that the ozone water treatment was executed for 3 minutes using the ozone water having the concentration of 5 ppm and produced by using oxygen only without using nitrogen as the material of the ozone gas at Step S109.

The solar battery in the Example 3 was manufactured similarly to that in the Example 1 except that the (bubbling) ozone water treatment was executed for 3 minutes not by immersing the silicon substrate in the ozone water produced in advance but by directly blowing the ozone gas into the pure water in which the silicon substrate was immersed at Step S109.

The solar battery in the Example 4 was manufactured similarly to that in the Example 1 except that hydrogen peroxide at 5 ppm was added to the ozone water at Step S109.

The solar battery in the Example 5 was manufactured similarly to that in the Example 1 except that ultraviolet rays at a wavelength of 254 nanometers were irradiated on the ozone water at consumed power of 200 watts at Step S109.

The solar battery in the Example 6 was manufactured similarly to that in the Example 1 except that hydrochloric acid was added to the ozone water having the concentration of 5 ppm and produced by using only oxygen instead of using nitrogen as the material of the ozone gas so as to satisfy 36% HCl:ozone water=1:5 (volume ratio) at Step S109.

As for the solar battery in the Example 7, the ozone water treatment was executed at Step S109 while immersing the silicon substrate in the ozone water at the concentration of 5 ppm and generating cavitation in the ozone water by irradiating ultrasonic waves at a frequency of 28 kilohertz. The solar battery in the Example 7 was manufactured similarly to that in the Example 1 except that nitrogen was not used in addition to oxygen as the material of the ozone gas at the time of producing the ozone water.

As for the solar battery in the Example 8, the ozone water treatment was executed while immersing the silicon substrate in the ozone water that had the concentration of 5 ppm and that was prepared by pressuring the ozone gas and dissolving the ozone gas in the pure water while applying pressure of 0.5 megapascal to the pure water, reducing the pressure of this ozone water to 0.05 megapascal, and generating air bubbles in the ozone water at Step S109. The solar battery in the Example 8 was manufactured similarly to that in the Example 1 except that nitrogen was not used in addition to oxygen as the material of the ozone gas at the time of producing the ozone water.

The solar battery in the reference example 1 was manufactured similarly to that in the Example 1 except that the silicon substrate was immersed in a solution of HCl (36 wt %):$H_2O_2$ (30 wt %):$H_2O$=1:1:7 (volume rate) at 80° C. for 3 minutes (so-called SC2 cleaning (HPM cleaning) in the RCA cleaning) at Step S109.

The solar battery in the reference example 2 was manufactured similarly to that in the Example 1 except that the silicon substrate was immersed in a solution of $H_2SO_4$ (96 wt %):$H_2O_2$ (30 wt %)=1:4 (volume ratio) at 80° C. for 3 minutes (so-called SPM cleaning) at Step S109.

As for the solar battery in the Example 9, the ozone water treatment was executed while immersing the silicon substrate in the ozone water having the concentration of 5 ppm at the room temperature for 3 minutes at Step S109. At the time of producing the ozone water, nitrogen in addition to oxygen was used as the material of the ozone gas.

The solar battery in the Example 10 was manufactured similarly to that in the Example 9 except that the silicon substrate was immersed in a solution of HCl (36 wt %):$H_2O$=1:7 (volume ratio) at the room temperature for 3 minutes at Step S109.

The solar battery in the reference example 3 was manufactured similarly to that in the Example 9 except that the silicon substrate was immersed in the solution of HCl (36 wt %):$H_2O_2$ (30 wt %):$H_2O$=1:1:7 (volume rate) at 80° C. for 3 minutes (so-called SC2 cleaning (HPM cleaning) in the RCA cleaning) at Step S109.

The solar battery in the reference example 4 was manufactured similarly to that in the Example 9 except that the silicon substrate was immersed in the solution of $H_2SO_4$ (96 wt %):$H_2O_2$ (30 wt %)=1:4 (volume ratio) at 80° C. (so-called SPM cleaning) at Step S109. FIG. 6 collectively depicts conditions for respective processing steps in the comparative example, the Examples 1 to 10, and the reference examples 1 to 4. FIG. 6 depicts conditions for the respective processing steps in the comparative example, the Examples 1 to 10, and the reference examples 1 to 4.

Figure 7:
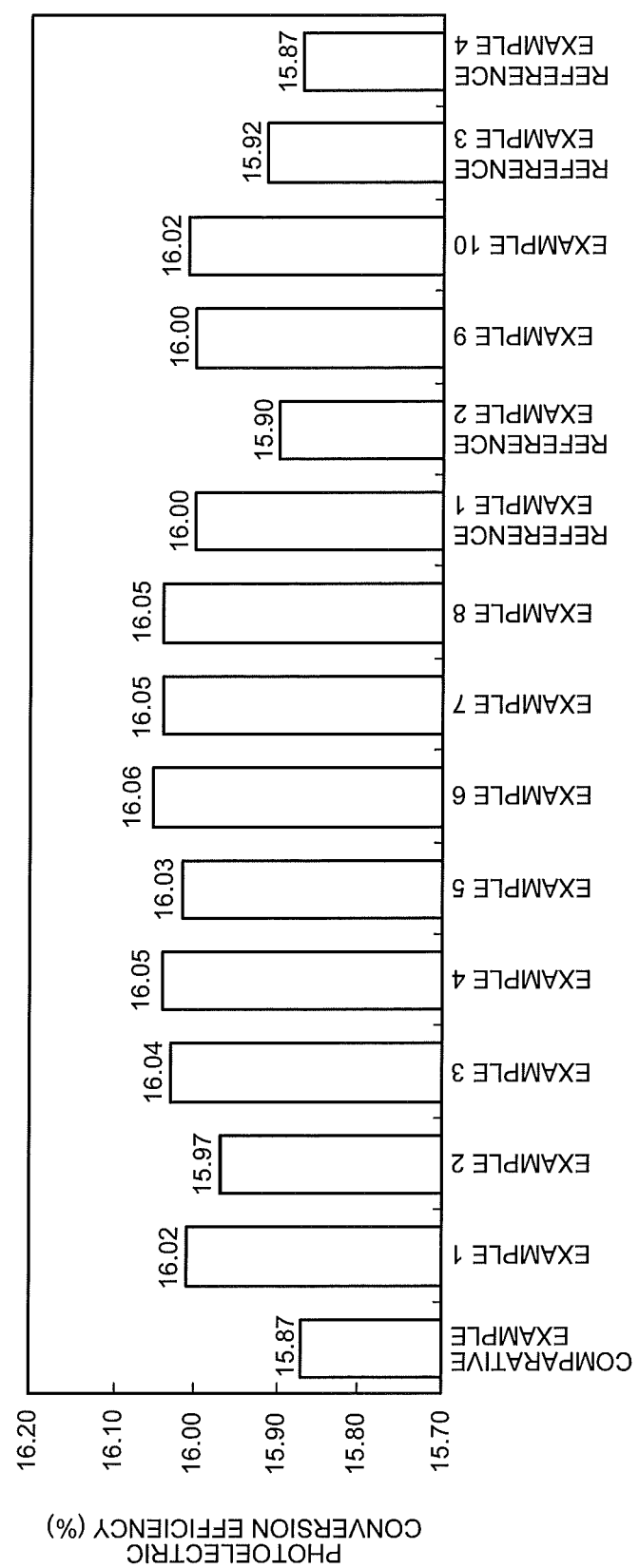
FIG. 7 is a characteristic diagram of photoelectric conversion efficiencies of solar batteries in the Examples, the comparative example, and the reference examples.

FIG. 7 is a characteristic diagram of photoelectric conversion efficiencies of solar batteries in the comparative example, the Examples 1 to 10, and the reference examples 1 to 4, respectively. As shown in FIG. 7, the comparison of the Examples 1 to 10 with the reference examples 1 to 4 shows that the solar batteries in all of the Examples 1 to 10 are higher in the photoelectric conversion efficiency than those in the reference examples 1 to 4. This indicates that the ozone water cleaning has a higher cleaning effect than those of the SC2 cleaning and the SPM cleaning. It can be considered that the cleaning method of a silicon substrate shown in the present embodiment is useful for cleaning of a silicon substrate on which texture is formed by using metal catalysts.

Furthermore, Patent Literature 3 discloses that the metal and organic impurities are removed from the surface of the semiconductor substrate by the repetition of the ozone water and the hydrofluoric acid treatment. However, Patent Literature 3 does not describe the removing mechanism in the interiors of the complicated pores formed in the surface of the semiconductor substrate. The reason is as follows. With the cleaning method described in Patent Literature 3, the oxide film is formed by oxidizing the surface of the semiconductor substrate and this oxide film is subjected to the hydrofluoric acid treatment, whereby the oxide film is removed, the metal and organic impurities are lifted off, the metal and organic impurities adhering to the surface of the semiconductor substrate are removed from the surface of the semiconductor substrate, the metal impurities are oxidized, ionized, and removed, and the organic impurities are decomposed and easily removed.

Even if the substrate cleaning treatment was executed by the SC2 cleaning (HPM: (hydrochloric acid)+hydrogen peroxide ($H_2O_2$)) in the RCA cleaning or by the SPM cleaning (sulfuric acid ($H_2SO_4$)+hydrogen peroxide ($H_2O_2$)) in place of the ozone water cleaning, it was not possible to efficiently remove the metal catalysts on the bottoms of the pores formed in the silicon substrate. This is because the reaction between the hydrochloric acid and the hydrogen peroxide or that between the sulfuric acid and the hydrogen peroxide generate the air bubbles, and the diameter of the air bubbles generated by these reactions is about 10 to 100 micrometers and is larger than that of the pores formed in the silicon substrate. That is, in the SC2 cleaning and the SPM cleaning, the air bubbles are generated in the cleaning liquid and it is less easy to generate the air bubbles within the pores formed in the silicon substrate. Furthermore, in these cleaning, the diameter of the air bubbles generated in the solution is about 10 to 100 micrometers and larger than that of the pores formed in the silicon substrate. Accordingly, it is not possible to efficiently remove the impurities such as the metal impurities from within the pores.

Moreover, in a case of the SC2 cleaning and the SPM cleaning, because of the high viscosity of the cleaning liquid, it is not possible to clean the interiors of the pores unless the pore diameter is equal to or larger than 200 nanometers. It is difficult for the cleaning liquid used in the SC2 cleaning and the SPM cleaning to enter into the pores because of the high viscosity if the pore diameter is smaller than 200 nanometers. That is, because the ozone water is lower in the viscosity of the solution than those of the SC2 cleaning and the SPM cleaning, the ozone water cleaning can clean the interiors of the pores formed in the silicon substrate more effectively than the SC2 cleaning and the SPM cleaning.

Therefore, the treatments by the SC2 cleaning (HPM: (hydrochloric acid (HCl)+hydrogen peroxide ($H_2O_2$))), the hydrochloric acid (HCl) cleaning, and the SPM cleaning (sulfuric acid ($H_2SO_4$)+hydrogen peroxide ($H_2O_2$)) were unable to remove the metal impurities from within the porous layers as disclosed in Patent Literature 2 although being able to remove the metal and organic impurities from the surface of the silicon substrate.

Furthermore, the comparison of the Example 9 with the reference examples 1 to 4 in FIG. 7 shows as follows. The Example 9 has the higher cleaning effect than those according to conventional techniques without degrading the photoelectric conversion efficiency of the solar battery although the metal ion concentration during the porous formation using the metal ions at Step S101 is $2\times10^{-5}$ mole [M] lower than $1\times10^{-4}$ mole [M] shown in Patent Literature 2. This follows that the cleaning method of a silicon substrate described in the present embodiment is useful for cleaning of a silicon substrate on which texture is formed by using metal catalysts.

The reason is as follows. If the silver ion concentration is lower than $1\times10^{-4}$ mole [M] at the time of forming the texture using the metal ions according to Patent Literature 2, the pores formed in the silicon substrate have irregular depths and the mixed acid etching is unable to remove the metal impurities entering deep into the deep pores. Furthermore, even if the SC2 cleaning and the SPM cleaning are further executed to such pores, the high viscosity of the cleaning liquid makes it difficult for the cleaning liquid to enter into the pores and to remove the metal impurities entering into the pores.

The invention of the present application is not limited to the above embodiment, and when the present invention is carried out, the invention can be variously modified without departing from the scope thereof. In the above embodiment, inventions of various stages are included, and various inventions can be extracted by appropriately combining a plurality of constituent elements disclosed therein. For example, even when some constituent elements are omitted from all constituent elements described in the embodiment, as far as the problems mentioned in the section of Solution to Problem can be solved and effects mentioned in the section of Advantageous Effects of Invention are obtained, the configuration from which these constituent elements have been omitted can be extracted as an invention.

INDUSTRIAL APPLICABILITY

As described above, the cleaning method of a silicon substrate according to the present invention is useful for a case where a solar battery with a high photoelectric conversion efficiency is manufactured by forming texture in a silicon substrate by using metal catalysts.

| Reference Signs List | |
|---|---|
| 1 | metal catalyst |
| 2 | porous layer |
| 2a | pore |
| 3 | silicon substrate |
| 4 | ozone water |
| 5 | gap obtained by oxidizing and ionizing metal catalyst |
| 6 | surface of which silicon substrate hydrophilic |
| 7 | air bubble |
| 8 | small air bubble |
| 9 | larger air bubble |
| 101 | metal catalyst |
| 102a | pore |
| 103 | silicon substrate |

The invention claimed is:

1. A cleaning method of a silicon substrate comprising:
a first step of etching a surface of a silicon substrate by a metal-ion-containing mixed aqueous solution of an oxidizing agent and hydrofluoric acid, and of forming a porous layer on the surface of the silicon substrate;

a second step of etching the porous layer by mixed acid mainly containing hydrofluoric acid and nitric acid, and of forming texture on the surface of the silicon substrate;

a third step of etching the surface of the silicon substrate on which the texture is formed by an alkaline chemical solution; and a fourth step of treating the silicon substrate etched by the alkaline chemical solution with ozone-containing water, of generating an air bubble within the pore formed in the silicon substrate, and of removing metal and organic impurities from within the pore.

2. The cleaning method of a silicon substrate according to claim 1, comprising a fifth step of removing an oxide film on the surface of the silicon substrate by the hydrofluoric acid, the fifth step being performed between the third step and the fourth step.

3. The cleaning method of a silicon substrate according to claim 1, comprising a sixth step of removing an oxide film on the surface of the silicon substrate by the hydrofluoric acid, the sixth step being performed after the fourth step.

4. The cleaning method of a silicon substrate according to claim 3, wherein the fourth step and the sixth step are repeated at least once after the sixth step.

5. The cleaning method of a silicon substrate according to claim 1, wherein the ozone-containing water contains hydrogen peroxide.

6. The cleaning method of a silicon substrate according to claim 1, wherein at the fourth step, ultraviolet rays are irradiated on the ozone-containing water.

7. The cleaning method of a silicon substrate according to claim 1, wherein at the fourth step, ultrasound waves are irradiated on the ozone-containing water to generate cavitation within the pore of the porous layer.

8. The cleaning method of a silicon substrate according to claim 1, wherein the ozone-containing water contains hydrochloric acid or sulfuric acid.

9. The cleaning method of a silicon substrate according to claim 1, wherein at the fourth step, an air bubble is generated within the pore of the porous layer by reducing a pressure of the ozone-containing water in a state of immersing the silicon substrate in the ozone-containing water prepared by pressurizing ozone gas and dissolving the ozone gas in water.

10. The cleaning method of a silicon substrate according to claim 1, wherein the ozone-containing water is generated by using oxygen and nitrogen as material gas or using air as the material gas.

11. The cleaning method of a silicon substrate according to claim 1, wherein at the first step, a metal ion concentration of the mixed aqueous solution is set to be equal to or higher than $2 \times 10^{-5}$ mole and lower than $8 \times 10^{-4}$ mole.

12. A manufacturing method of a solar battery comprising:

a step of cleaning a silicon substrate after forming texture on one surface of the silicon substrate of a first conduction type by a cleaning method of a silicon substrate including:

a first step of etching a surface of a silicon substrate by a metal-ion-containing mixed aqueous solution of an oxidizing agent and hydrofluoric acid, and of forming a porous layer on the surface of the silicon substrate;

a second step of etching the porous layer by mixed acid mainly containing hydrofluoric acid and nitric acid, and of forming texture on the surface of the silicon substrate;

a third step of etching the surface of the silicon substrate on which the texture is formed by an alkaline chemical solution; and a fourth step of treating the silicon substrate etched by the alkaline chemical solution with ozone-containing water, of generating an air bubble within the pore formed in the silicon substrate, and of removing metal and organic impurities from within the pore;

a step of diffusing an impurity element of a second conduction type to one surface of the silicon substrate, and of forming an impurity diffused layer; and a step of forming an electrode each on the one surface and the other surface of the silicon substrate.

\* \* \* \* \*